(12) United States Patent
Yao

(10) Patent No.: US 11,333,688 B2
(45) Date of Patent: May 17, 2022

(54) REFLECTIVE CURRENT AND MAGNETIC SENSORS BASED ON OPTICAL SENSING WITH INTEGRATED TEMPERATURE SENSING

(71) Applicant: Xiaotian Steve Yao, Diamond Bar, CA (US)

(72) Inventor: Xiaotian Steve Yao, Diamond Bar, CA (US)

( * ) Notice: Subject to any disclaimer, the term of this patent is extended or adjusted under 35 U.S.C. 154(b) by 622 days.

(21) Appl. No.: 15/435,177

(22) Filed: Feb. 16, 2017

(65) Prior Publication Data

US 2017/0234912 A1 Aug. 17, 2017

Related U.S. Application Data

(60) Provisional application No. 62/295,894, filed on Feb. 16, 2016.

(51) Int. Cl.
*G01R 15/24* (2006.01)
*G01K 11/32* (2021.01)
*G01R 19/00* (2006.01)

(52) U.S. Cl.
CPC ............ *G01R 15/246* (2013.01); *G01K 11/32* (2013.01); *G01R 19/0092* (2013.01)

(58) Field of Classification Search
CPC .... G01R 19/00; G01R 19/0092; G01R 19/32; G01R 15/24; G01R 15/246; G01R 15/247; G01R 33/032; G01K 11/00; G01K 11/32; G01J 4/00; G01D 5/26; G01D 5/266; G01D 5/268; G01D 5/28; G01D 5/285;

(Continued)

(56) References Cited

U.S. PATENT DOCUMENTS

| 4,563,639 A | 1/1986 | Langeac |
| 4,612,500 A | 9/1986 | Chen et al. |
| 4,947,107 A | 8/1990 | Doerfler et al. |

(Continued)

FOREIGN PATENT DOCUMENTS

| CN | 1580789 A | 2/2005 |
| CN | 101403768 A | 4/2009 |

(Continued)

OTHER PUBLICATIONS

Day, G. W., et al., "Faraday rotation in coiled, monomode optical fibers: isolators, filters, and magnetic sensors," Optics Letters vol. 7, No. 5, 1982.

(Continued)

*Primary Examiner* — Son T Le
(74) *Attorney, Agent, or Firm* — Perkins Coie LLP

(57) ABSTRACT

Optical techniques and sensor devices for sensing or measuring electric currents and/or temperature based on photonic sensing techniques in optical reflection modes by using optical dielectric materials exhibiting Faraday effects are provided in various configurations. The disclosed optical sensing technology uses light to carry and transmit the current or temperature information obtained at the sensing location to a remote base station and this optical transmission allows remote sensing in various applications and provide a built-in temperature calibration mechanism to enhance the measurement accuracy in a range of different temperature conditions.

7 Claims, 20 Drawing Sheets

Reflective current sensor design with low DOP source

(58) Field of Classification Search
CPC .. G01D 5/30; G01D 5/32; G01D 5/34; G01D 5/341
See application file for complete search history.

(56) References Cited

U.S. PATENT DOCUMENTS

| | | | | |
|---|---|---|---|---|
| 5,053,617 | A | * 10/1991 | Kakizaki | G01R 15/24 250/227.21 |
| 5,063,290 | A | 11/1991 | Kersey | |
| 5,136,235 | A | 8/1992 | Braendle et al. | |
| 5,416,860 | A | * 5/1995 | Lee | G01R 15/246 250/227.17 |
| 5,483,347 | A | 1/1996 | Hollmann | |
| 5,764,046 | A | 6/1998 | Bosselmann | |
| 5,895,912 | A | * 4/1999 | Bosselmann | G01R 15/247 250/227.17 |
| 6,122,415 | A | * 9/2000 | Blake | G01R 15/242 250/227.17 |
| 8,212,556 | B1 | * 7/2012 | Schwindt | G01R 33/26 324/301 |
| 8,624,579 | B2 | 1/2014 | Chamorovskiy et al. | |
| 9,733,133 | B2 | 8/2017 | Yao | |
| 2003/0004412 | A1 | 1/2003 | Izatt et al. | |
| 2005/0088662 | A1 | 4/2005 | Bohnert et al. | |
| 2010/0265014 | A1 | 10/2010 | Bowers et al. | |
| 2011/0115469 | A1 | 5/2011 | Kondo et al. | |
| 2011/0277552 | A1 | 11/2011 | Chen et al. | |
| 2012/0091991 | A1 | * 4/2012 | Konno | G01R 15/246 324/95 |
| 2012/0187937 | A1 | * 7/2012 | Blake | G01R 33/032 324/96 |
| 2014/0300341 | A1 | 10/2014 | Davis et al. | |
| 2015/0097551 | A1 | * 4/2015 | Yao | G01K 11/32 324/96 |
| 2016/0011237 | A1 | 1/2016 | Konno et al. | |
| 2017/0234912 | A1 | 8/2017 | Yao | |

FOREIGN PATENT DOCUMENTS

| | | |
|---|---|---|
| CN | 102721847 A | 10/2012 |
| WO | 9940446 A1 | 8/1999 |

OTHER PUBLICATIONS

Sun, L., et al., "All-Fiber Optical Magnetic Field Sensor Based on Faraday Rotation in Highly Terbium Doped Fiber," Laboratory for Laser Energetics Review, vol. 120, pp. 206-209, 2009.

White, A. D., et al., "Advances in Optical Fiber-Based Faraday Rotation Diagnostics," LLNL, 17th IEEE International Pulsed Power Conference, 2009.

* cited by examiner

REFLECTIVE CURRENT AND MAGNETIC SENSORS BASED ON OPTICAL SENSING WITH INTEGRATED TEMPERATURE SENSING

CROSS REFERENCE TO RELATED APPLICATIONS

This patent document claims the benefit of priority of U.S. Provisional Patent Application No. 62/295,894, filed on Feb. 16, 2016. The entire content of the before-mentioned patent application is incorporated by reference as part of the disclosure of this document.

TECHNICAL FIELD

This patent document relates to techniques and devices for sensing an electric current and temperature.

BACKGROUND

An electric current is an electrical signal due to flow of charges in an electrically conductive path such as a metal. Given the electrical nature of the electric currents, techniques and devices for sensing or measuring an electric current have been largely based on electronic circuits. Electronic circuits usually require electrical power and can be adversely affected by electromagnetic interference (EMI). Various electronic circuits for sensing currents need to be located at the locations where the currents are measured and this may impose practical limitations in various applications.

SUMMARY

This patent document discloses techniques and devices for sensing or measuring electric currents and temperature based on detecting reflected light from a photonic sensor head deployed at a location where a current or temperature is measured. In the disclosed optical sensing technology, the sensing media are optical dielectric materials exhibiting Faraday effects and therefore provide immunity to EMI. The disclosed optical sensing technology uses light to carry and transmit the current or temperature information obtained at the sensing location to a remote base station and this optical transmission allows a long distance remote sensing. In addition, the optical processing of the detected signals provides additional advantages that are missing or difficult to achieve in other sensing techniques that are entirely based on electronic circuitry.

BRIEF DESCRIPTION OF DRAWINGS

FIG. 7 shows a first embodiment of a WDM (wavelength division multiplexing) based magnetic/current sensor with temperature monitoring and compensation.

FIG. 8 illustrates a second embodiment a WDM based magnetic/current sensor with temperature monitoring and compensation.

FIG. 9 illustrates a third embodiment of WDM based magnetic/current sensor with temperature monitoring and compensation.

FIG. 10 shows a fourth embodiment of a WDM based magnetic/current sensor with temperature monitoring and compensation by using another way to separate and monitor light from different WDM channels at $\lambda 1$ and $\lambda 2$.

FIG. 11 illustrates a fifth embodiment of a WDM based magnetic/current sensor with temperature monitoring and compensation.

DETAILED DESCRIPTION

Figure 1:
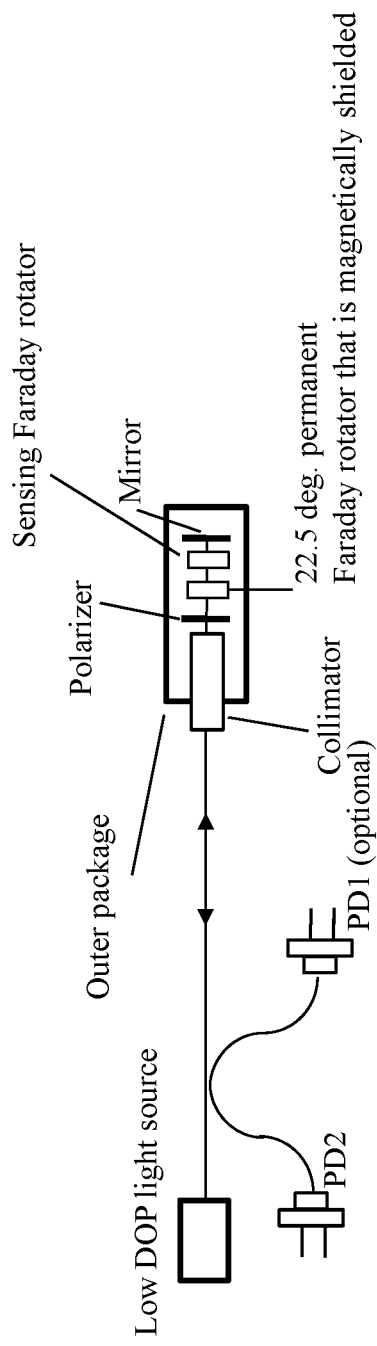
FIG. 1 shows a first embodiment of the reflective current sensor. A remote light source with low degree of polarization (DOP) with a pigtail of either single mode (SM) fiber or multimode fiber is used.

Sensing of an electric current based on a fiber optic current sensor is attractive for monitoring, control, and protection of substations and power distribution systems in smart grid. Comparing with some existing current sensors, they have the advantage of being able to separate the sensor head that senses the current to be measured and electronic processing unit for processing a signal that contains the current information at different locations, and can use the optical sensing nature of such technology to eliminate any electrical power and electronic circuitry at the sensor head, making the sensor head immune to electromagnetic interferences or damages triggered by strong electromagnetic fields or interferences and safe for high voltage applications. Implementations of fiber optic current sensors can be configured to achieve other advantages, including small size, light weight, low power consumption, immunity to current saturation or others. Some implementations of optical current sensors based on Faraday effects in glasses or crystals have the advantages of compact size, light weight, low cost, and easy installation e.g., being able to be directly mounted on a current conducting cable even with a live current flow, and can significantly reduce the installation cost. Because of the low cost and small size, such optical current sensors can be applied to low and medium voltage applications for transformer monitoring and other current sensing applications.

Accuracy, dynamic range, and environmental stability are the main performance indicators for the fiber optic current sensors. An effective way to increase the dynamic range is to increase the magnetic field detection sensitivity, requiring significantly reducing the noise in optoelectronics detection circuitry. The temperature dependence of the Verdet constants of the Faraday glasses or crystals poses challenges for the for the measurement accuracy and need to be addressed in the sensor systems design. The temperature effect on the optical signal derived from the sensor head can impact the environmentally stable operation of the sensor, and thus it is advantageous to provide a mechanism for compensating for the temperature effect. In addition, interferences of the magnetic fields from the neighboring current carrying conductors can also affect the current detection accuracy, and thus should be reduced or minimized.

In the disclosed technology in this patent document, optical sensing can be used to remotely measure electric currents or temperature by directing probe light from a base station via an optical fiber to an optical sensor head deployed at a target location to use the probe light to obtain and carry the information of the current or temperature to be measured and redirecting the probe light from the optical sensor head back to a base station for processing. Certain technical features in connection with the technology disclosed in this patent document are related to or described in U.S. Patent Publication No. US 2015/0097551 A1 on Apr. 9, 2015 of U.S. patent application Ser. No. 14/509,015 entitled "FARADAY CURRENT AND TEMPERATURE SENSORS" and filed on Oct. 7, 2014 based on U.S. Provisional Application No. 61/887,897 filed Oct. 7, 2013. Both applications are incorporated by reference as part of this patent document.

Fiber optic current sensor is attractive for various applications, including, e.g., the monitoring, control, and protection of substations and power distribution systems in smart grid and in aluminum production using electrolysis process. Comparing with traditional current sensors, they have the advantage of being able to separate the sensor head and electronic processing unit in different locations, and therefore do not require any electrical power at the sensor head, making it safe for high voltage applications. In addition, they are generally more accurate than their electrical counterparts, especially when performing measurements over wide temperature ranges. Other advantages include small size, light weight, immune to electromagnetic interferences, low power consumption, and no current saturation. Accuracy, dynamic range, and environmental stability are the main performance indicators for the fiber optic current sensors. An effective way to increase the dynamic range is to increase the magnetic field detection sensitivity, requiring significantly reduction in the noise in optoelectronics detection circuitry. The temperature dependence of the Verdet constants of the Faraday glasses or crystals poses challenges for the for the measurement accuracy and must be overcome in the sensor systems design. In addition, the temperature effect on an optical signal derived from the sensor head can affect the measurements and thus should be calibrated or compensated for achieving environmentally stable operation of the sensor.

Compact sensor designs may use a sensor head that is polarization sensitive and the output powers can fluctuate with the polarization of the input light changes. Such polarization sensitivity can be reduced by using a light source with a low degree of polarization (DOP), such as an Amplified spontaneous emission (ASE) source, in optical configurations illustrated in this document. The reflective designs shown in the examples in this document can be used to simplify the overall optical packaging of such optical sensors to provide improved sensing performance.

For example, some implementations of the disclosed reflective designs do not impose a requirement on the polarization orientation of the input optical device with respect to the input light with low DOP. This aspect of the designs reduces the sensitivity of the optical sensor head to the optical polarization and is beneficial. For another example, a polarizer placed after the Faraday sensing material may be removed in various designs. This is beneficial in part due to the reduced complexity and device components in the optical sensors. In addition, temperature sensing can be implemented based on current sensor designs and can be used for compensating temperature sensitivity of the Faraday material used in the current sensor head. Reflective designs using optical fiber as the sensing material are also provided in this document. Some disclosed designs are configured to integrate the current sensor with the temperature sensor for achieving high environmental stability with low cost.

In the examples described in this document, the current sensor head is shown as an all optical current sensor head formed by optical components without local electronic circuits or components. In this regard, the sensor head does not include any optical detector that converts light into electrical signals or any detector circuitry for electrical signal processing. The sensor head directs light carrying the measurement information of the current to the current sensor base station via a fiber link. In this context, the sensor head is an all-optical current sensor head and is placed by or at a current-carrying conductor to sense the current based on the optical polarization rotation caused by the magnetic field associated with the current in the Faraday material inside the all-optical current sensor. When the current to be measured is perpendicular to the light propagation path of the Faraday rotator, the magnetic field produced by the current is along the light propagation path of the Faraday rotator and thus exerts most influence to the polarization rotation of the light. The probe light from the broad bandwidth light source is directed to the current sensor head and a returned light beam is directed back from the current sensor head to the photodiode (PD) detection unit within the current sensor base station via fiber and is detected to extract information on the electric current sensed by the current sensor head. The low DOP property of the probe light is to assure the optical power stability passing through the sensor head if single mode fiber (SMF) or multimode fiber (MMF) is used to deliver light into the sensor head located remotely at the current sensing site. If a more expensive polarization maintaining (PM) fiber is used, a light source with high DOP can be used and the polarization axis of the probe light is aligned with the slow (or fast) axis of the PM fiber.

FIG. 1 shows a first embodiment of the reflective current sensor. A remote light source with low degree of polarization (DOP) with a pigtail of either single mode (SM) fiber or multimode fiber is used. If the DOP of the light source is not sufficiently low, a depolarizer can be used to reduce the DOP. The light with low DOP is brought to the optical head located at a place with a magnetic field or current conductor to be sensed. The low DOP light is first collimated, then passes or transmits through an optical polarizer chip/device to be repolarized before it passes through a permanent Faraday rotator with a nominal 22.5 degree rotation angle. This permanent Faraday rotator is magnetically shielded from influence of any external magnetic field, preventing the influence of the magnetic field from a current such as the current to be sensed. In addition to the magnetically shielded permanent Faraday rotator, this design includes a sensing Faraday material that is not magnetically shielded and is exposed to a magnetic field from a current to be measured. This magnetic field from the current to be measured causes a rotation in polarization of the sensing Faraday material. This polarization rotation caused by the current is used to measure the current. The polarization rotation angle produced by the sensing Faraday material varies with the temperature of the material and this dependence of the rotation with the temperature, when the material is free of an external magnetic field along the light propagation direction, can be used to measure the temperature at the material. The polarized the light then goes through the sensing Faraday material before it is reflected back by an end mirror towards the collimator at the input/output port of the optical sensor head. Under this optical reflective design, the reflected light in the optical sensor head passes through the magnetically shielded permanent Faraday rotator twice so that its polarization rotation after the second passing is 45 degrees from the passing axis of the polarizer when the external magnetic field to be sensed is absent. This 45-degree rotated polarization in the reflected optical output from the optical sensor head has a certain optical power level. When the polarization rotation is different from the 45 degrees, the deviation in the polarization rotation from the 45-degree polarization can be reflected in the measured optical power of the reflected optical output from the optical sensor head. When this deviation in the polarization rotation from the 45-degree polarization is caused by the external magnetic field, the measurement of the optical power deviation in the optical power passing through the polarizer and entering the fiber can be used to determine the magnitude of the external magnetic field and thus the current that produces the external magnetic field. The detected photocurrent $I_1$ at the photodetector PD1 is:

$$I_1 = I_0(1 + \sin 2\theta) \quad (1)$$

where $$\theta = \alpha_1(T)M + \alpha_2(T - T_0) \quad (2)$$

is the polarization rotation angle caused by the magnetic field and the temperature to be sensed, $\alpha_1(T)$ is the proportional constant relating the magnetic field M to the rotation angle and is temperature dependent, $\alpha_2$ is the is proportional constant relating the rotation angle $\theta$ to the temperature, and $T_0$ is the temperature at which $\theta=0$ in the absent of the magnetic field. For an alternating magnetic field, such as that generated by an alternating current (AC), the rotation angle, which is proportional to the magnetic current or current, can be obtained by separating the AC and DC component of Eq. (1) and taking their ratio:

$$\theta = \alpha_1(T)M + \alpha_2(T - T_0) = I_1/2I_0, \quad (3)$$

For a DC current or magnetic field, the signal from the monitoring PD2 is required to eliminate any optical power drift of the light source over time.

The current sensor example in FIG. 1 can be implemented to provide a current sensor based on optical sensing. Such a device can include a light source that produces probe light; a fiber line having a first fiber line terminal coupled to receive the probe light from the light source and to direct the received probe light to a second fiber line terminal of the fiber line; and an optical current sensor head coupled to the second fiber line terminal of the fiber line to receive the probe light. The sensor head can be configured to include an input optical polarizer to filter the probe light to produce a polarized input beam, a first Faraday material that is magnetically shielded from an influence of any external magnetic field and located along an optical path of the polarized input beam, a second Faraday material that is not magnetically shielded and placed in an optical path of the polarized input beam to sense a magnetic field produced by a current to be measured, and an optical reflector downstream from the first and second Faraday materials along an optical path of the polarized input beam to reflect the polarized input beam back to the first and second Faraday materials and the input optical polarizer to return to the fiber line. The sensor device can further include an optical detection unit including an optical detector coupled to the fiber line to receive at least a portion of the reflected light in the fiber line from the optical current sensor head that carries information of the current to be measured; and a measurement module that receives an detector output from the optical detector to obtain information of the current. In some implementation, the measurement module can include an amplifier circuit to amplify the detector output from the optical detector, an analog to digital converter to convert an output of the amplifier circuit into a digital signal, and a microprocessor to process the digital signal representing information of the current.

The disclosed technology can be used to construct a temperature sensor based on optical sensing. Such a device can include a light source that produces probe light; a fiber line having a first fiber line terminal coupled to receive the probe light from the light source and to direct the received probe light to a second fiber line terminal of the fiber line; an optical temperature sensor head coupled to the second fiber line terminal of the fiber line to receive the probe light. This head can be configured to include an input optical polarizer to filter the probe light to produce a polarized input beam, a Faraday material that is magnetically shielded from an influence of any external magnetic field and located along an optical path of the polarized input beam and varies a Faraday rotation angle in response to a change in temperature at the Faraday material, and an optical reflector downstream from the Faraday material along an optical path of the polarized input beam to reflect the polarized input beam back to the Faraday material and the input optical polarizer to return to the fiber line. The device further includes an optical detector coupled to the fiber line to receive at least a portion of the reflected light in the fiber line from the optical temperature sensor head that carries information of the temperature to be measured; and a measurement module that receives an detector output from the optical detector to obtain information of the temperature.

In FIG. 1, two optical detectors PD1 and PD2 are provided where PD1 is optional and may be used to monitor the power level of the probe beam going into the current/magnetic sensor head and PD2 is used to monitor the power level of the reflected probe beam from the current/magnetic sensor head.

Figure 2:
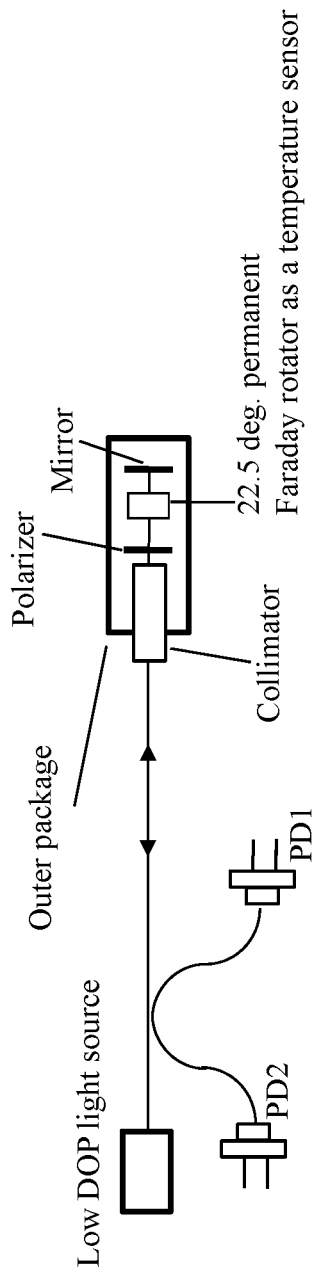
FIG. 2 shows an example of a temperature sensor head based on the optical sensor head design in FIG. 1 by removing the Faraday sensing material in FIG. 1 so that the magnetically shielded permanent Faraday rotator is used as a temperature sensing material.

FIG. 2 shows an example of a temperature sensor head, in which the Faraday sensing material in FIG. 1 is removed. The permanent Faraday rotator is used to sense a rotation change caused by the temperature in FIG. 2 and may be magnetically shielded to reduce a undesired influence to its rotation by an external magnetic field. When operated in a location where the external magnetic influence is insignificant or known to be a certain constant level, the magnetic shielding may not be needed since the rotation caused by the presence of the known magnetic field can be calibrated in measuring the local temperature. The temperature T can be obtained as from Eq. (3) as:

$$T=T_0+(I_1-\beta I_2)/2\alpha_2 \quad (4)$$

where $I_1$ is the photocurrent in PD1 and $I_2\beta I_0$ is the photocurrent detected by PD2.

Figure 3:
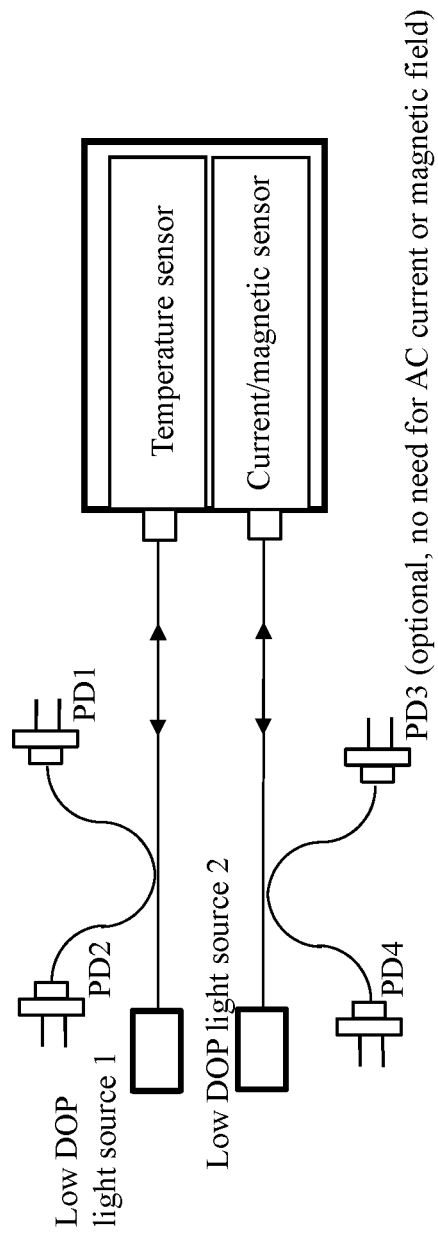
FIG. 3 illustrates an example of a magnetic/current sensor head packaged with a temperature sensor head in the optical reflective sensor head configurations shown in FIGS. 1 and 2.

FIG. 3 illustrates an example of a magnetic/current sensor head packaged with a temperature sensor head in the optical reflective sensor head configurations shown in FIGS. 1 and 2 based on disclosed technology. The temperature obtained from the temperature head can be used to calibrate out the temperature dependence of the current sensor head. In this example, two different low DOP light sources are used for respectively producing the probe light beams to the temperature sensor head and to the current/magnetic sensor head via two separate fiber lines. Two optical couplers are coupled in the two fiber lines, respectively, for coupling light to optical detectors to measure the current and the temperature t the sensor heads. For the temperature sensor operation, two optical detectors PD1 and PD2 are provided where PD1 is used to monitor the power level of the probe beam going into the temperature sensor head and PD2 is used to monitor the power level of the reflected probe beam from the temperature sensor head. For the current/magnetic sensor operation, two optical detectors PD3 and PD4 are provided where PD3 is optional and may be used to monitor the power level of the probe beam going into the current/magnetic sensor head and PD4 is used to monitor the power level of the reflected probe beam from the current/magnetic sensor head.

Figure 4:
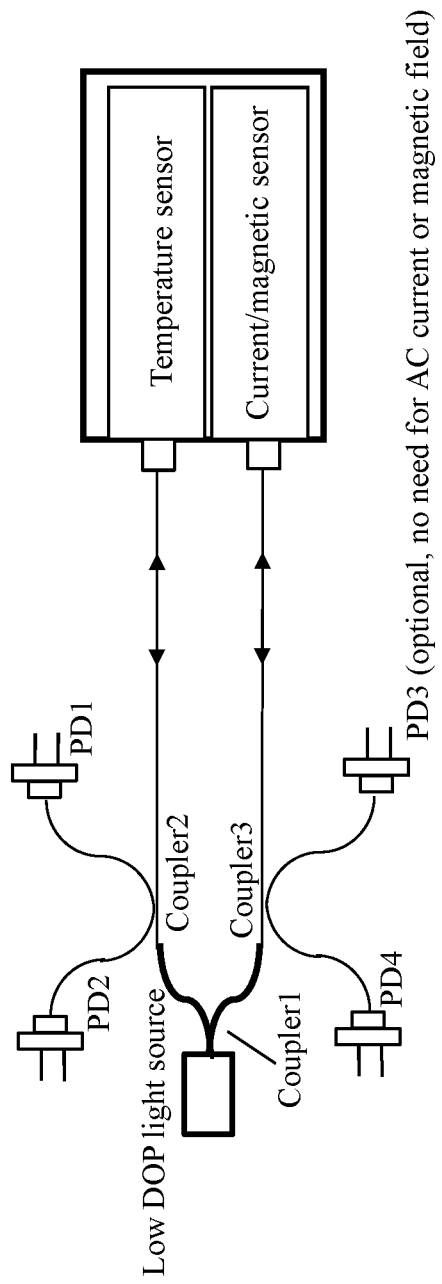
FIG. 4 illustrates another example of a magnetic/current sensor head packaged with a temperature sensor head b using a common low DOP light source and an optical coupler (Coupler 1) that splits the output probe light beam from the light source into two different probe beams to be directed to the temperature sensor head and the current/magnetic sensor head via two fiber lines, respectively.

FIG. 4 illustrates another example of a magnetic/current sensor head packaged with a temperature sensor head b using a common low DOP light source and an optical coupler (Coupler 1) that splits the output probe light beam from the light source into two different probe beams to be directed to the temperature sensor head and the current/magnetic sensor head via two fiber lines, respectively. The reflected probe beams from the two sensor heads are then coupled out of their respective fiber lines by optical couplers 2 and 3 for optical sensing operations. For the temperature sensor operation, two optical detectors PD1 and PD2 are provided where PD1 is used to monitor the power level of the probe beam going into the temperature sensor head and PD2 is used to monitor the power level of the reflected probe beam from the temperature sensor head. For the current/magnetic sensor operation, two optical detectors PD3 and PD4 are provided where PD3 is optional and may be used to monitor the power level of the probe beam going into the current/magnetic sensor head and PD4 is used to monitor the power level of the reflected probe beam from the current/magnetic sensor head. The temperature obtained from the temperature head can be used to calibrate out the temperature dependence of the current sensor head. Various current and temperature sensors disclosed in this document can be used to implement the sensor designs in FIGS. 3 and 4.

Figure 5:
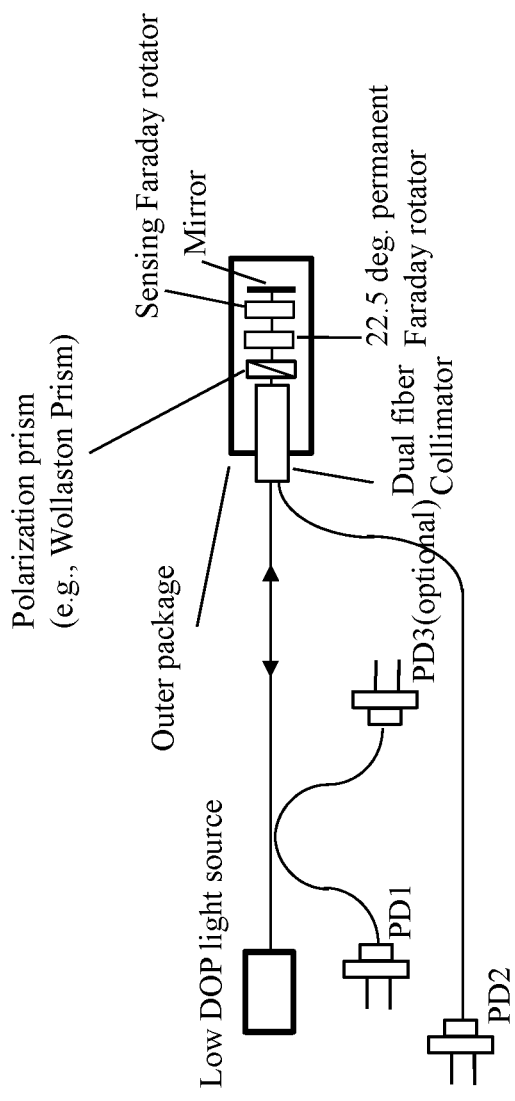
FIG. 5 shows another example of a magnetic/current sensor head based on the design in FIG. 1 with additional features, where a Wollaston prism is used to replace the polarizer in FIG. 1 and a third optical detector is used.

FIG. 5 shows another example of a magnetic/current sensor head based on the design in FIG. 1 with additional features, where a Wollaston prism is used to replace the polarizer in FIG. 1 and a third optical detector is used. The light beam of one of the state of polarization (SOP) is allowed to get to the mirror in the sensor head and be reflected back towards the collimator. After passing through the 22.5 degree permanent Faraday rotator and the sensing Faraday material twice, the SOP of the reflected beam is around 45 degrees from the Wollaston's principle axis and being split by the prism into two beams of orthogonal SOPs with an angle. The collimators then focuses the two beams into two optical fibers. Three optical detectors PD1, PD2 and PD3 are shown in this particular example. The photocurrents in PD1 and PD2 are used to detect the powers of the two polarization components in the reflected probe light from the sensor head. PD3 is optional for monitoring the light output from the low DOP light source. When the electrical gains for the detection circuits are properly adjusted, the photovoltages from PD1 and PD2 can be expressed as:

$$V_1=V_0(1+\sin 2\theta), \quad (5)$$

$$V_2=V_0(1-\sin 2\theta) \quad (6)$$

The polarization rotation angle caused by the magnetic field and by the temperature can be expressed by the following equation:

$$\sin 2\theta = \frac{V_1-V_2}{V_1+V_2}, \quad (7)$$

where $\theta=\alpha_1(T)M+\alpha_2(T-T_0)$. It is clear that the rotation angle is sensitive to the temperature.

Figure 6:
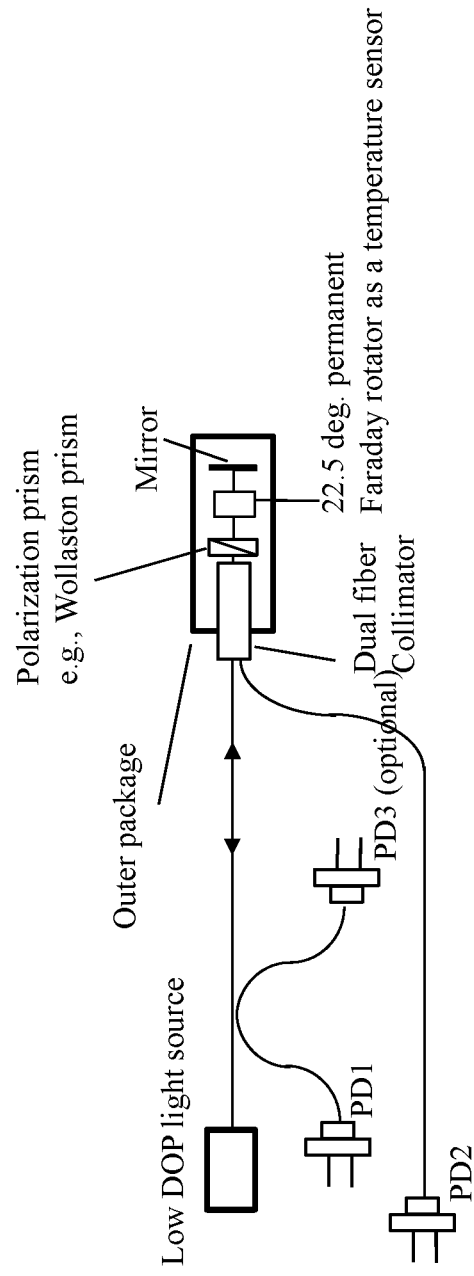
FIG. 6 shows an example of a temperature sensor head based on the sensor head design in FIG. 5 in which the Faraday sensing material in FIG. 5 is removed and the magnetically shielded permanent Faraday rotator is used for sensing the temperature.

FIG. 6 shows an example of a temperature sensor head based on the sensor head design in FIG. 5 in which the Faraday sensing material in FIG. 5 is removed and the magnetically shielded permanent Faraday rotator is used for sensing the temperature. The temperature T can be obtained by Eq. (7):

$$T=T_0+(V_1-V_2)/[2\alpha_2(V_1+V_2)] \quad (8)$$

when the T is obtained, the temperature induced rotation angle can be abstracted out and the true magnetic field induced rotation can be obtained.

The examples in FIGS. 5 and 6 represent a class of optical sensors that operate based on a use of two different optical polarizations by having a polarization splitting device such as a Wollaston prism with two fiber lines.

A current sensor based on this design can include a light source that produces probe light; a first fiber line having a first fiber line terminal coupled to receive the probe light from the light source and to direct the received probe light to a second fiber line terminal of the first fiber line; an optical current sensor head coupled to the second fiber line terminal of the first fiber line to receive the probe light and configured to include a polarization prism to separate the probe light into a first and second polarized input beams in different polarizations, a first Faraday material that is magnetically shielded from an influence of any external magnetic field and located along an optical path of the first polarized input beam, a second Faraday material that is not magnetically shielded and placed in an optical path of the first polarized input beam to sense a magnetic field produced by a current to be measured, an optical reflector downstream from the first and second Faraday materials along an optical path of the first polarized input beam to reflect the first polarized input beam back to the first and second Faraday materials and the polarization prism which splits the reflected light into first and second reflected light beams in different polarizations, and a fiber coupler coupled to the second fiber line terminal of the first fiber line to direct the first reflected light beam into the first fiber line; a second fiber line coupled to the fiber coupler in the optical current sensor head to receive the second reflected light beam; an optical detection unit including a first optical detector coupled to the first fiber line to receive at least a portion of the first reflected light beam in the first fiber line from the optical current sensor head that carries information of the current to be measured, and a second optical detector coupled to the second fiber line to receive at least a portion of the second reflected light beam in the second fiber line from the optical current sensor head that carries information of the current to be measured; and a measurement module that receives detector outputs from the first and second optical detectors to obtain information of the current.

A temperature sensor based on this design can include a light source that produces probe light; a first fiber line having a first fiber line terminal coupled to receive the probe light from the light source and to direct the received probe light to a second fiber line terminal of the first fiber line; an optical temperature sensor head coupled to the second fiber line terminal of the first fiber line to receive the probe light and configured to include a polarization prism to separate the probe light into first and second polarized input beams of different polarizations, a Faraday material that is magnetically shielded from an influence of any external magnetic field and located along an optical path of the first polarized input beam and varies a Faraday rotation angle in response to a change in temperature at the Faraday material, an optical reflector downstream from the Faraday material along an optical path of the first polarized input beam to reflect the first polarized input beam back to the Faraday material and the polarization prism which splits the reflected light into first and second reflected light beams in different polarizations, and a fiber coupler coupled to the second fiber line terminal of the first fiber line to direct the first reflected light beam into the first fiber line; a second fiber line coupled to the fiber coupler in the optical temperature sensor head to receive the second reflected light beam; an optical detection unit including a first optical detector coupled to the first fiber line to receive at least a portion of the first reflected light beam in the first fiber line from the optical temperature sensor head that carries information of the temperature to be measured, and a second optical detector coupled to the second fiber line to receive at least a portion of the second reflected light beam in the second fiber line from the optical temperature sensor head that carries information of the temperature to be measured; and a measurement module that receives detector outputs from the first and second optical detectors to obtain information of the temperature.

The above optical sensor heads use probe light at a one optical wavelength. In other implementations, probe light at two different optical wavelengths can be used for current sensing and temperature sensing. FIGS. 7-11 show examples of such a design. Such a current sensor based on optical sensing can include a first light source that produces a first probe light beam at a first optical wavelength; a second light source that produces a second probe light beam at a second optical wavelength that is different from first optical wavelength; an optical coupling device that receives and combines the first and second probe light beams into a combined probe beam with probe light at the first and second optical wavelengths; a fiber line coupled to receive the combined probe light beam from the optical coupling device; and an optical current sensor head coupled to the fiber line to receive the combined probe light beam. The head can be configured to include an input optical polarizer to filter the combined probe light beam to produce a polarized input beam, a Faraday rotator to rotate polarization, which is magnetically shielded from an external magnetic field and located along an optical path of the polarized input beam, a dichroic filter located downstream from the Faraday rotator to receive light from the Faraday rotator and configured to transmit light at the first optical wavelength and reflect light at the second optical wavelength, a sensing Faraday material that is not magnetically shielded and placed in an optical path of light transmitted by the dichroic filter to sense a polarization rotation in light at the second optical wavelength caused by a temperature change and a magnetic field of an electric current at or near the sensing Faraday material, and an optical reflector downstream from the sensing Faraday material to reflect the light at the second optical wavelength back to the sensing Faraday material, the dichroic filter, the Faraday rotator and the input optical polarizer to return to the fiber line along with reflected light at the second optical wavelength. The optical coupling device coupled to the fiber line receives reflected light from the optical current sensor head and splits the received light into a first reflected beam at the first optical wavelength and a second reflected beam at the second optical wavelength. The device also includes a first optical detector coupled to receive the first reflected beam that carries information of the current to be measured and an influence of a temperature at the optical current sensor head; a second optical detector coupled to receive the second reflected beam that carries information of the temperature at the sensing Faraday material; and a measurement module that receives detector outputs from the first and second optical detectors to obtain information of the current to be measured and to compensate for an effect to the current measurement by the temperature.

Figure 7:
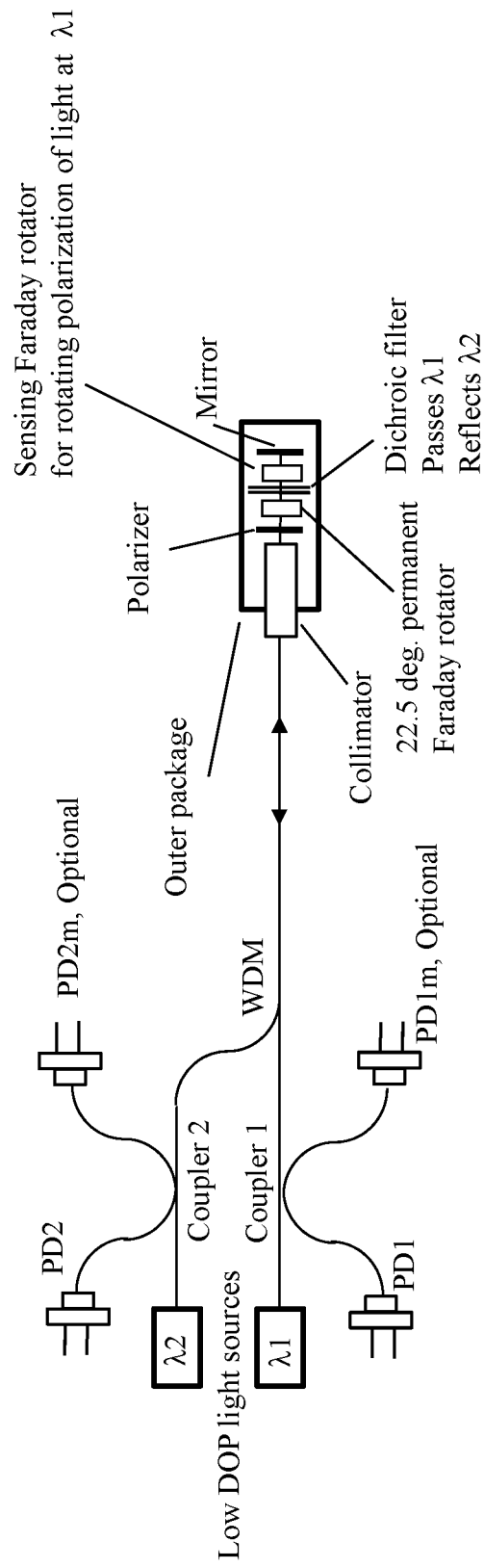
FIGS. 7-11 show implementation examples of optical sensor heads use probe light at two different optical wavelengths for current sensing and temperature sensing based on wavelength division multiplexing.

FIG. 7 is a first embodiment of a WDM (wavelength division multiplexing) based magnetic/current sensor with temperature monitoring and compensation. Two low DOP light sources at $\lambda 1$ and $\lambda 2$ are combined with a WDM and then input into the optical head. A dichroic filter, which passes $\lambda 1$ but reflects $\lambda 2$, is inserted between the 22.5-degree permanent Faraday rotator and the sensing Faraday material. Since the reflected $\lambda 2$ light only experiences the influence of the 22.5-degree rotator and the associated temperature induced polarization rotation $\theta_1 = \alpha_2(T-T_0)$, it can be used to monitor the temperature of the optical head. On the other hand, light of $\lambda 1$ carries the polarization rotation information of both the magnetic field and the temperature, $\theta = \alpha_1(T)M + \alpha_2(T-T_0)$. PD1 and PD2 are used to measure the photocurrents of the $\lambda 1$ and $\lambda 2$ channels respectively. The monitoring PD1$m$ and PD2$m$ are optional and is not required for AC magnetic field measurement. For DC magnetic field measurements, they may be used to monitor the optical power drifts and compensate for it in data processing. After $\theta_1$ and T are obtained from λ2 channel measurement, the magnetic field can be accurately obtained as:

$$M=[\theta-\theta_1(T)]/\alpha_1(T) \quad (9)$$

The relationship between $\alpha_1$ and T of the Faraday sensing material can be obtained experimentally. In Eq. (9), $\theta_1$ is assumed the same for both λ1 and λ2. If $\theta_1$ is different for probe light at λ1 and λ2, the ratio of $\alpha_2(\lambda_1)$ and $\alpha_2(\lambda_2)$ can be measured and this measurement can be used to modify $\theta_1(T)$ mathematically in the software.

Figure 8:
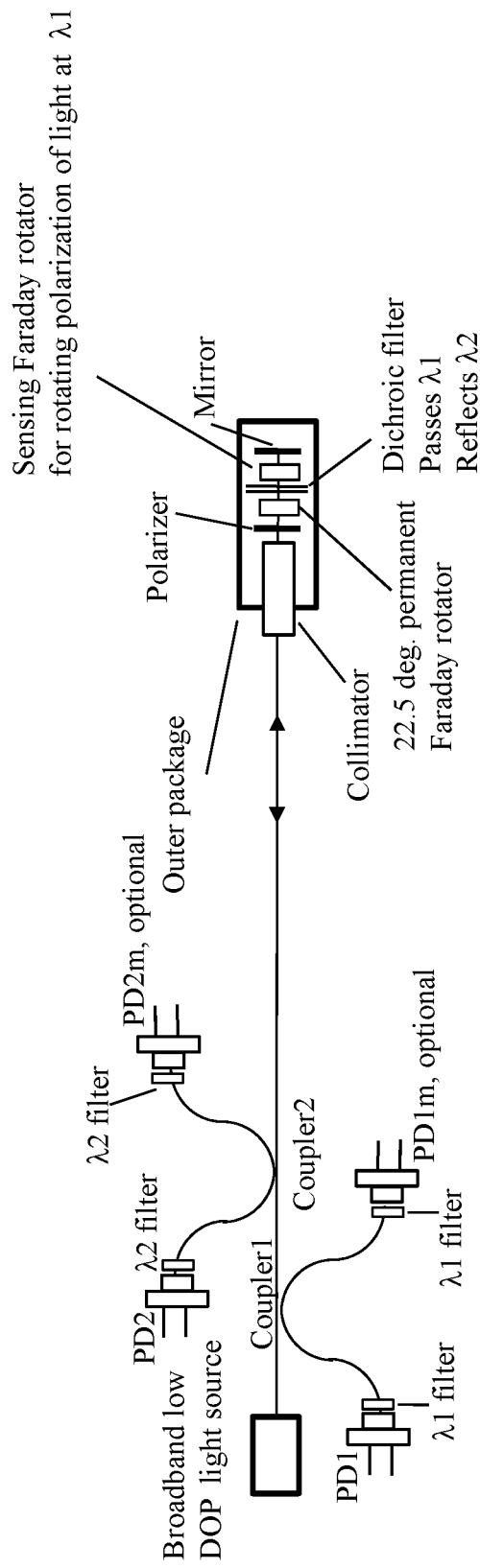

FIG. 8 illustrates a second embodiment a WDM based magnetic/current sensor with temperature monitoring and compensation. It differs from FIG. 7 in that a single broad band low DOP light source is used to replace the two light sources and to produce probe light at both optical wavelengths λ1 and λ2, the. In addition, bandpass filters are placed in front of PDs to make sure only light of selected wavelength is detected by the corresponding PD.

Figure 9:
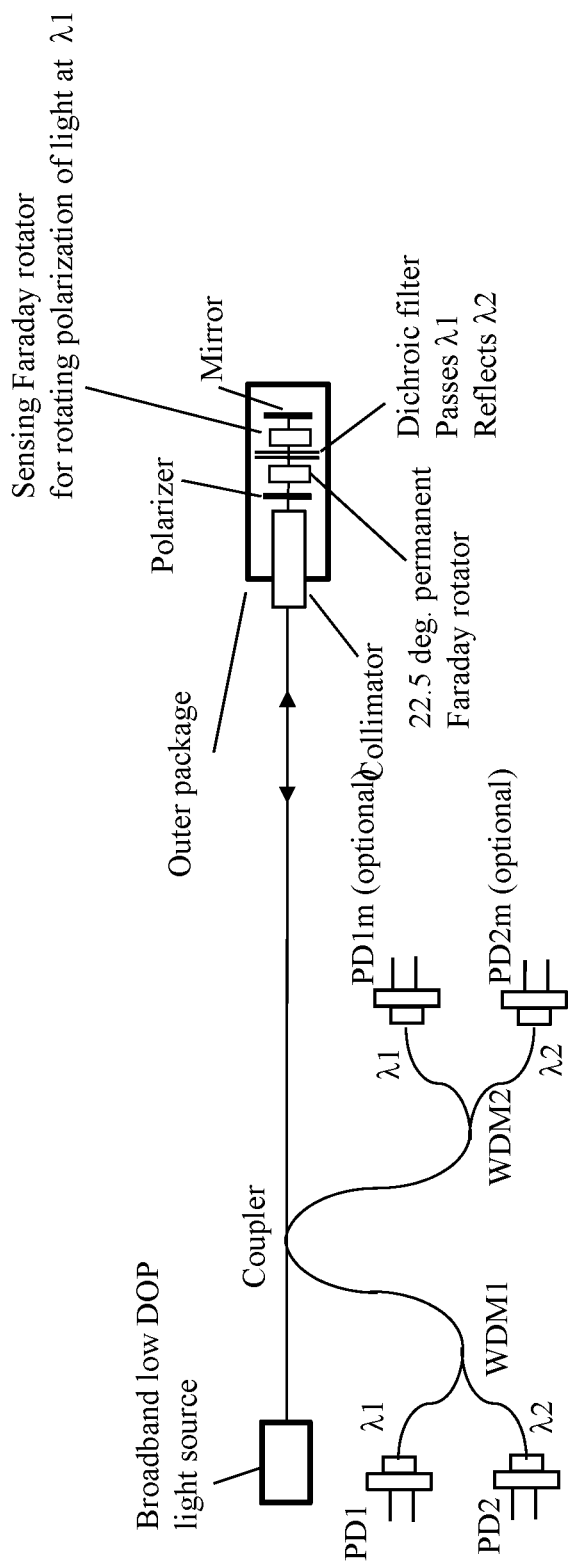

FIG. 9 illustrates a $3^{rd}$ embodiment of WDM based magnetic/current sensor with temperature monitoring and compensation. The difference between FIG. 8 and FIG. 9 is how the two wavelength channels at λ1 and λ2 are separated at the detection side by using different optical coupler designs.

Figure 10:
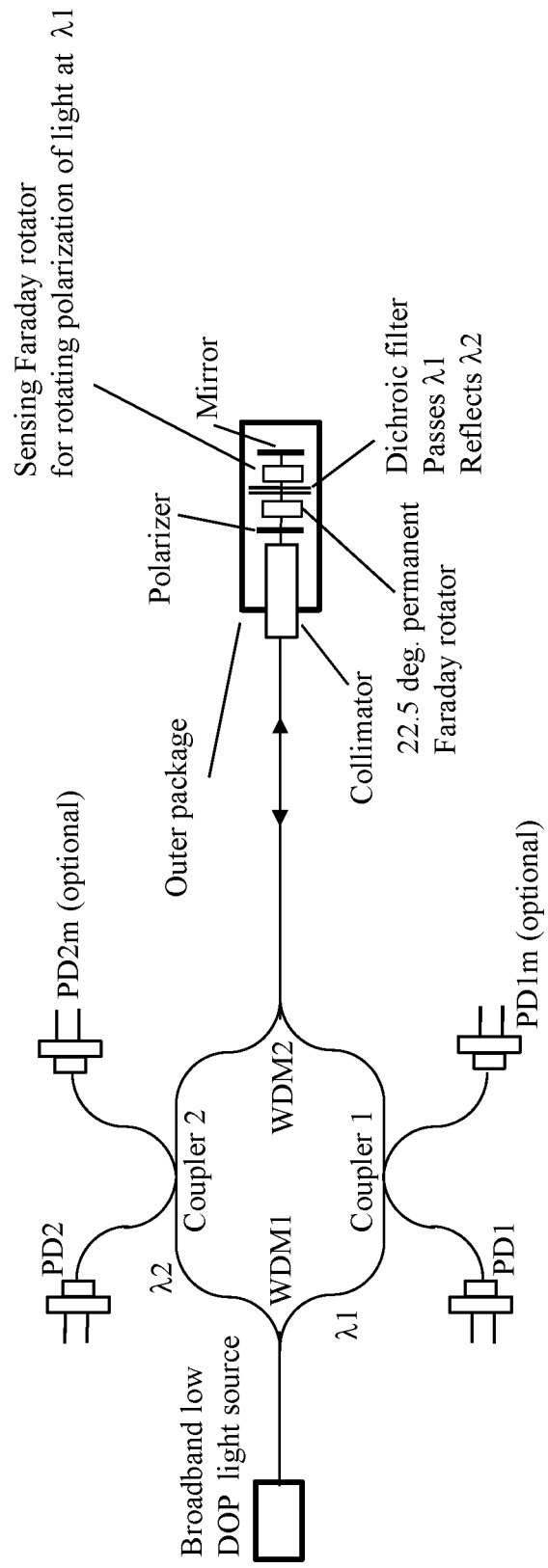

FIG. 10 shows a $4^{th}$ embodiment of a WDM based magnetic/current sensor with temperature monitoring and compensation by using another way to separate and monitor light from different WDM channels at λ1 and λ2.

Figure 11:
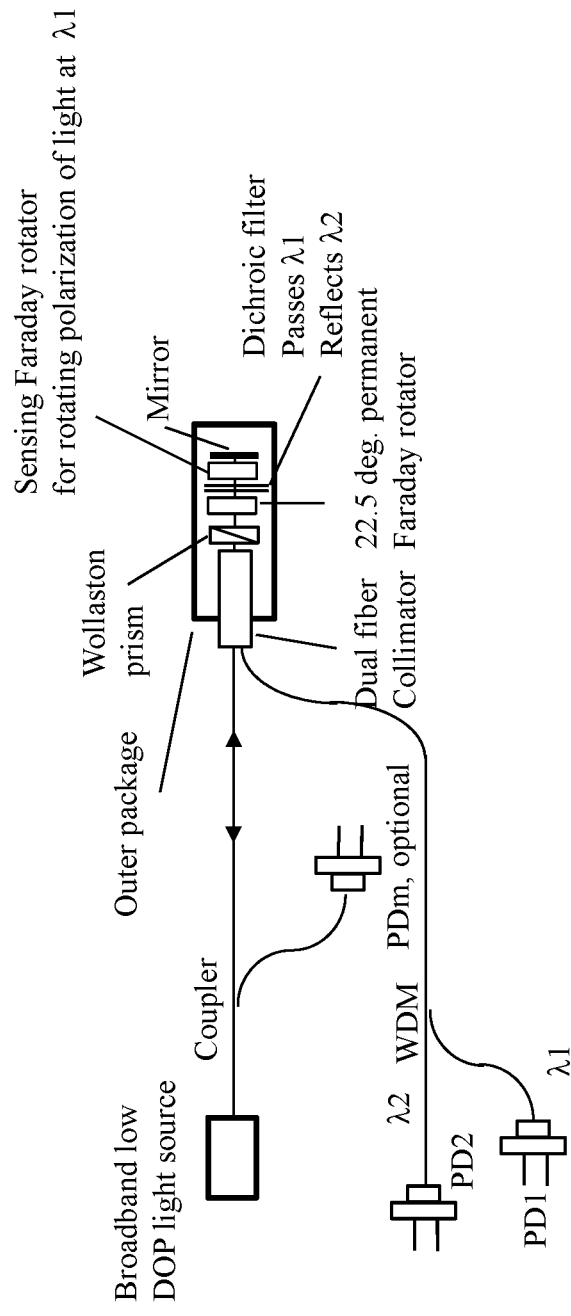

FIG. 11 illustrates a $5^{th}$ embodiment of a WDM based magnetic/current sensor with temperature monitoring and compensation. In this configuration, a Wollaston prism is used to replace the polarizer in the sensing head, just as in FIG. 5. In addition, a WDM is used to separate the two wavelength channels and direct them their corresponding photodetectors PD1 and PD2. PDm is an optional monitoring photodetector, which is not required for AC magnetic field sensing. For DC magnetic sensing, it can be used to monitor the power drift of the optical source and compensate the power drift either in software or in hardware by feedback back control.

Figure 12:
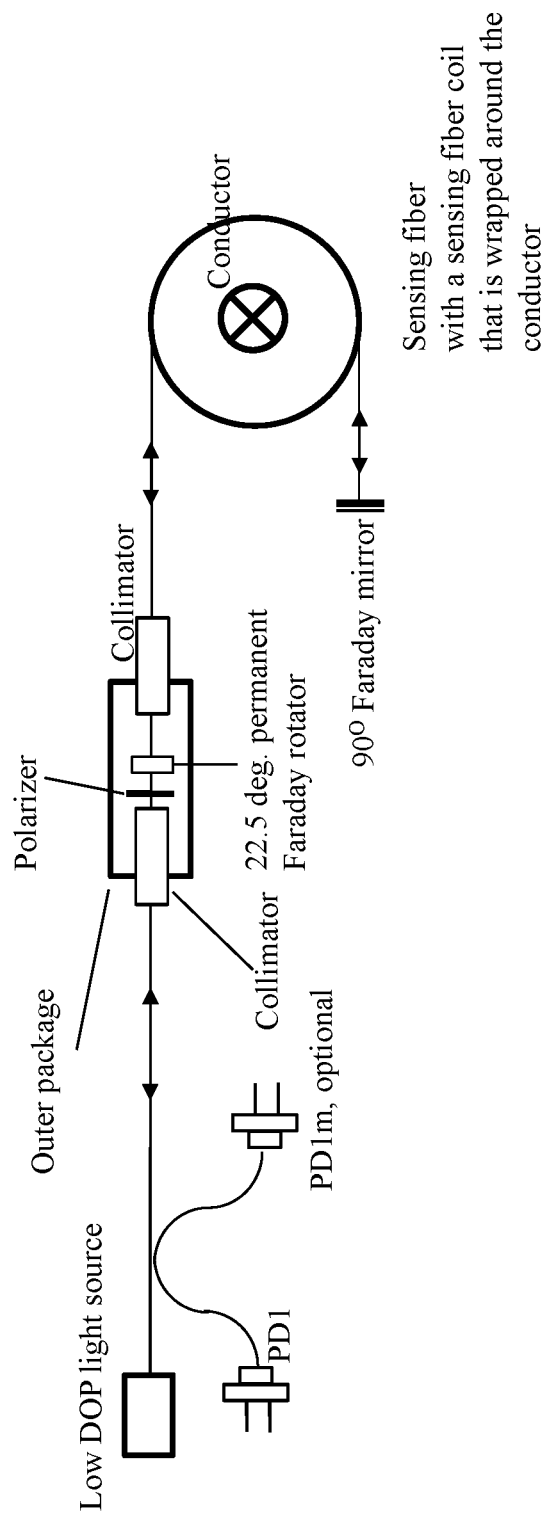
FIG. 12 illustrates an embodiment of a reflective magnetic sensor using a length of fiber to replace the Faraday sensing material in FIG. 1 and other examples described in this document.

FIG. 12 illustrates an embodiment of a reflective magnetic sensor using a length of fiber to replace the Faraday sensing material in FIG. 1 and other examples described above. This sensing fiber can be a low linear birefringence fiber or a spun fiber in some implementations. A Faraday mirror is used at the end of the sensing fiber to reflect light back towards the light source. The advantage of this configuration, as compared with that of FIG. 1, is that the sensing fiber can be made to encircle an electric current carrying conductor to eliminate the influence of magnetic fields outside of the enclosed loop.

In this embodiment, the sensing fiber that encircles the conductor to sense the magnetic field induced by the current flowing in the conductor is substantially free of undesired influence by other magnetic fields not from the current under measurement. Compared with the previous embodiments, this embodiment has the advantages of insensitivity to the interfering magnetic fields generated by conductors outside of the fiber loop and insensitivity to the installation of the fiber around the conductor. The other embodiments can be sensitive to the distance and orientation angles of the sensor head with respect to the conductor and is sensitive to the magnetic field generated by other current carrying conductors. Ideally, the sensing fiber should have no linear birefringence and the so called spun fiber is preferred. The 90 degree Faraday mirror is coupled to sensing fiber loop and is used to compensate for the residual linear birefringence inside the sensing fiber.

For a given Verdet constant a fiber material, the sensing fiber can be coiled with multiple turns to increase the polarization rotation angle. Examples of implementations of this aspect can be found in an article entitled "Advances in Optical Fiber-Based. Faraday Rotation Diagnostics" and published by White et al. of Lawrence Livermore National Laboratory in the 17th IEEE International Pulsed Power Conference in July of 2009, providing examples for using a fiber loop for sensing a current based on the Faraday effect (https://e-reports-ext.llnl.gov/pdf/376161.pdf). Another article by Day et al. entitled "Faraday rotation in coiled, mono mode optical fibers: isolators, filters and magnetic sensors" and published in Optics Letters in May of 1982 provides additional information on using a fiber coil for sensing a magnetic field based on the Faraday rotation in the fiber (https://www.osapublishing.org/ol/abstract.cfm?uri=ol-7-5-238). The above articles are incorporated by reference as part of the disclosure of this patent document.

The sensor example in FIG. 12 is one implementation of a current sensor based on optical sensing in a fiber coil. Such a sensor device can include a light source that produces probe light; a fiber line having a first fiber line terminal coupled to receive the probe light from the light source and to direct the received probe light to a second fiber line terminal of the fiber line; an optical polarizer coupled to the second fiber line terminal of the fiber line to receive the probe light and configured to filter the probe light to produce a polarized input beam; a Faraday rotator coupled in an optical path of the polarized input beam to cause a Faraday rotation; a segment of sensing fiber coupled to receive the probe light from the Faraday rotator and configured to include a fiber coil that is wrapped around a segment of a conductor carrying a current to be measured to sense a magnetic field produced by the current in the conductor; a Faraday reflector coupled to receive light from the segment of sensing fiber and to reflect the received light back into the segment of sensing fiber to pass through the Faraday rotator to return to the fiber line; an optical detection unit including an optical detector coupled to the fiber line to receive at least a portion of the reflected light in the fiber line from the optical current sensor head that carries information of the current to be measured; and a measurement module that receives an detector output from the optical detector to obtain information of the current.

Figure 13:
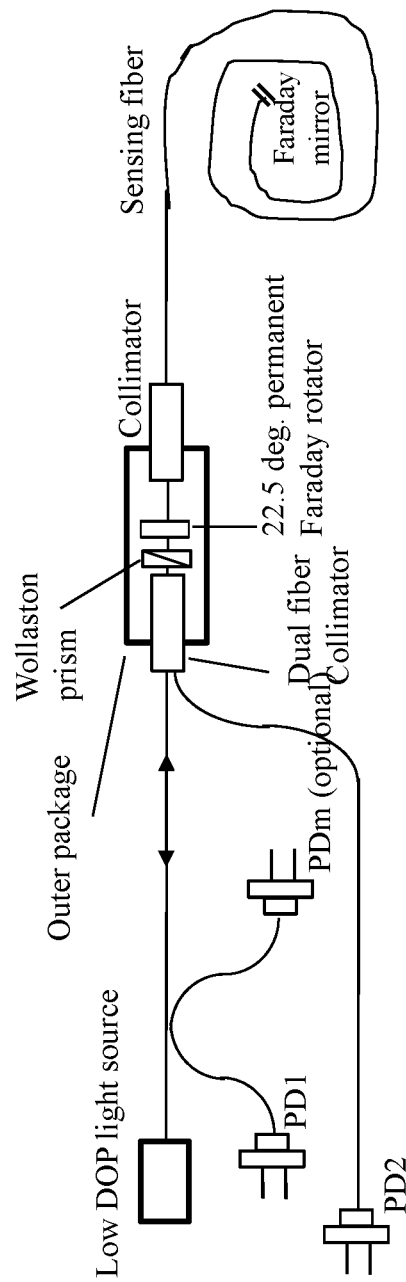
FIG. 13 illustrates an embodiment of a reflective magnetic sensor based on using a length of fiber to replace the Faraday sensing material in FIG. 5 with two fiber lines.

Specifically, FIG. 13 illustrates an embodiment of a reflective magnetic sensor based on using a length of fiber to replace the Faraday sensing material in FIG. 5 with two fiber lines. Such a current sensor based on optical sensing in a fiber coil can include a light source that produces probe light; a first fiber line having a first fiber line terminal coupled to receive the probe light from the light source and to direct the received probe light to a second fiber line terminal of the first fiber line; a polarization prism coupled to the second fiber line terminal of the first fiber line to receive the probe light and to separate the probe light into a first and second polarized input beams in different polarizations; a Faraday rotator located along an optical path of the first polarized input beam; a sensing fiber coil coupled to receive the probe light from the Faraday rotator and configured to wrap around a segment of a conductor carrying a current to be measured to sense a magnetic field produced by the current in the conductor; a Faraday reflector coupled to receive light from the sensing fiber coil to reflect the received light back into the sensing fiber coil to pass through the Faraday rotator and the polarization prism which splits the reflected light into first and second reflected light beams in different polarizations; a fiber coupler coupled to the second fiber line terminal of the first fiber line to direct the first reflected light beam into the first fiber line; a second fiber line coupled to the fiber coupler in the optical current sensor head to receive the second reflected light beam; an optical detection unit including a first optical detector coupled to the first fiber line to receive at least a portion of the first reflected light beam in the first fiber line that carries information of the current to be measured, and a second optical detector coupled to the second fiber line to receive at least a portion of the second reflected light beam in the second fiber line that carries information of the current to be measured; and a measurement module that receives detector outputs from the first and second optical detectors to obtain information of the current.

Two different probe light wavelengths can be used in connection with a sensing fiber coil. Such a sensor using a sensing fiber wrapped around a conductor for sensing the current carried by the conductor can include a light source that produces probe light at optical wavelengths including a first optical wavelength a second optical wavelength that is different from first optical wavelength; a fiber line coupled to receive the probe light from the light source; an optical polarizer coupled to the fiber line to filter the probe light from the fiber line to produce a polarized beam; a Faraday rotator coupled to receive the polarized beam to rotate polarization; a dichroic filter located downstream from the Faraday rotator to receive light from the Faraday rotator and configured to transmit light at the first optical wavelength and reflect light at the second optical wavelength; a sensing fiber coil placed in an optical path of light transmitted by the dichroic filter to receive the transmitted light and configured to wrap around a segment of a conductor carrying a current to be measured to sense a magnetic field produced by the current in the conductor; a Faraday reflector coupled to receive light at the second optical wavelength from the sensing fiber coil to reflect the received light back into the sensing fiber coil to pass through the dichroic filter, the Faraday rotator and the polarizer to return to the fiber line along with reflected light at the second optical wavelength; a first optical detector coupled to receive reflected light from the fiber line at the first optical wavelength that carries information of the current to be measured and an influence of a temperature at the fiber coil; a second optical detector coupled to receive reflected light from the fiber line at the second optical wavelength that carries information of the temperature at the Faraday rotator; and a measurement module that receives detector outputs from the first and second optical detectors to obtain information of the current to be measured and to compensate for an effect to the current measurement by the temperature.

Figure 14:
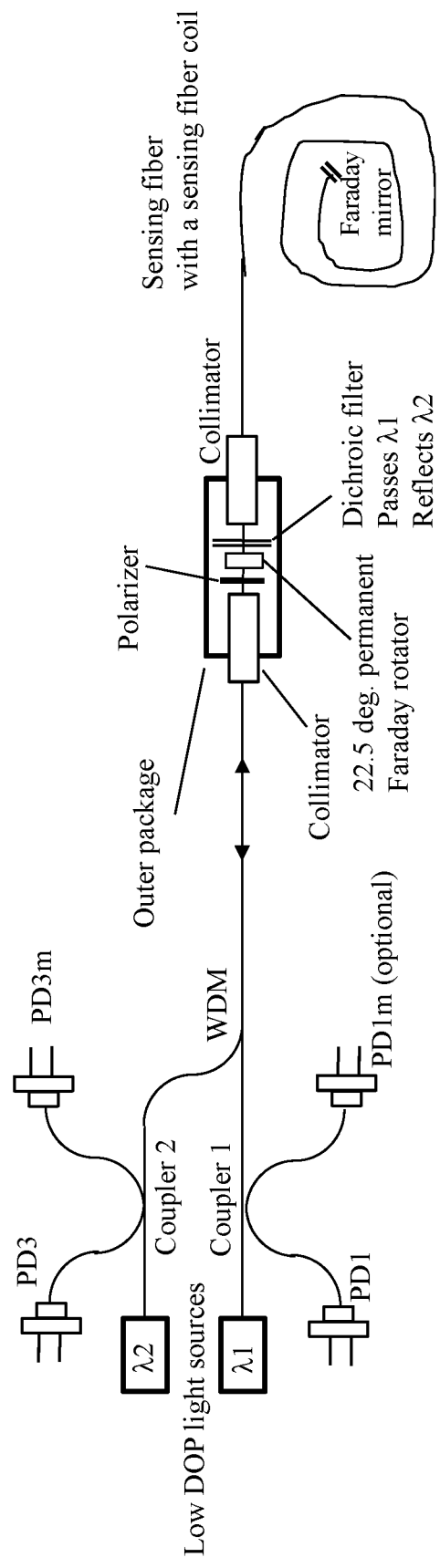
FIG. 14 illustrates an embodiment of a reflective magnetic sensor using a length of fiber to replace the Faraday sensing material in FIG. 7.
Figure 15:
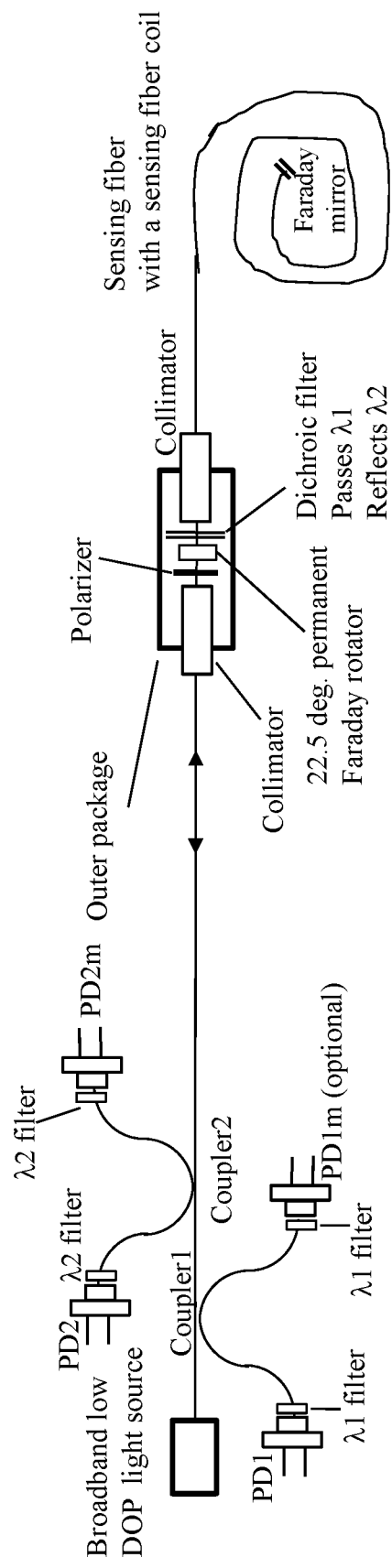
FIG. 15 illustrates an embodiment of a reflective magnetic sensor using a length of fiber to replace the Faraday sensing material in FIG. 8.

Specific examples for using two wavelengths and a dichroic filter are shown in FIGS. 14-19. FIG. 14 illustrates an embodiment of a reflective magnetic sensor using a length of fiber to replace the Faraday sensing material in FIG. 7. FIG. 15 illustrates an embodiment of a reflective magnetic sensor using a length of fiber to replace the Faraday sensing material in FIG. 8.

Figure 16:
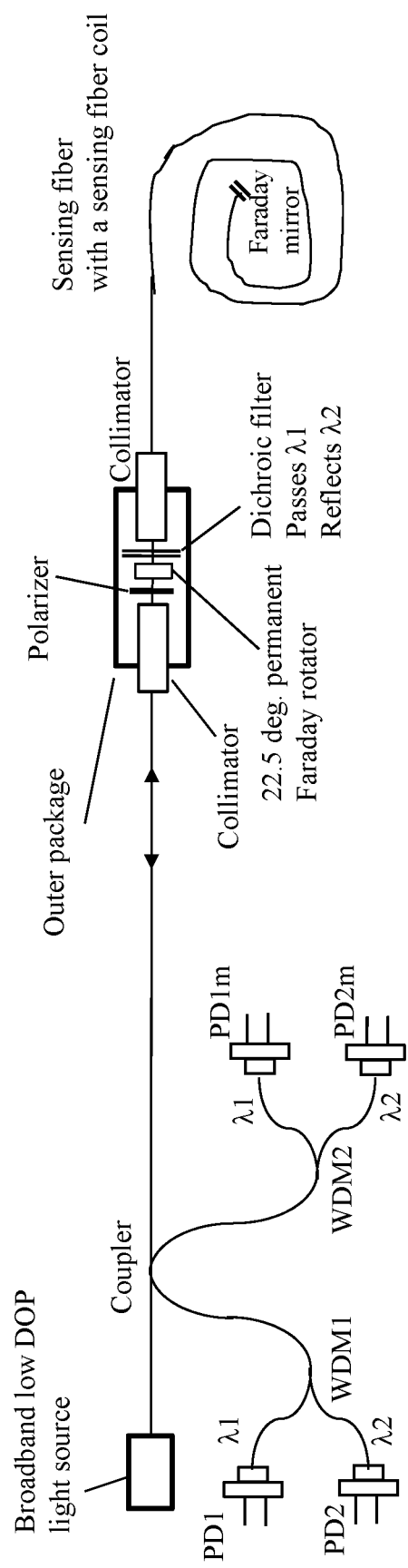
FIG. 16 illustrates an embodiment of a reflective magnetic sensor using a length of fiber to replace the Faraday sensing material in FIG. 9.
Figure 17:
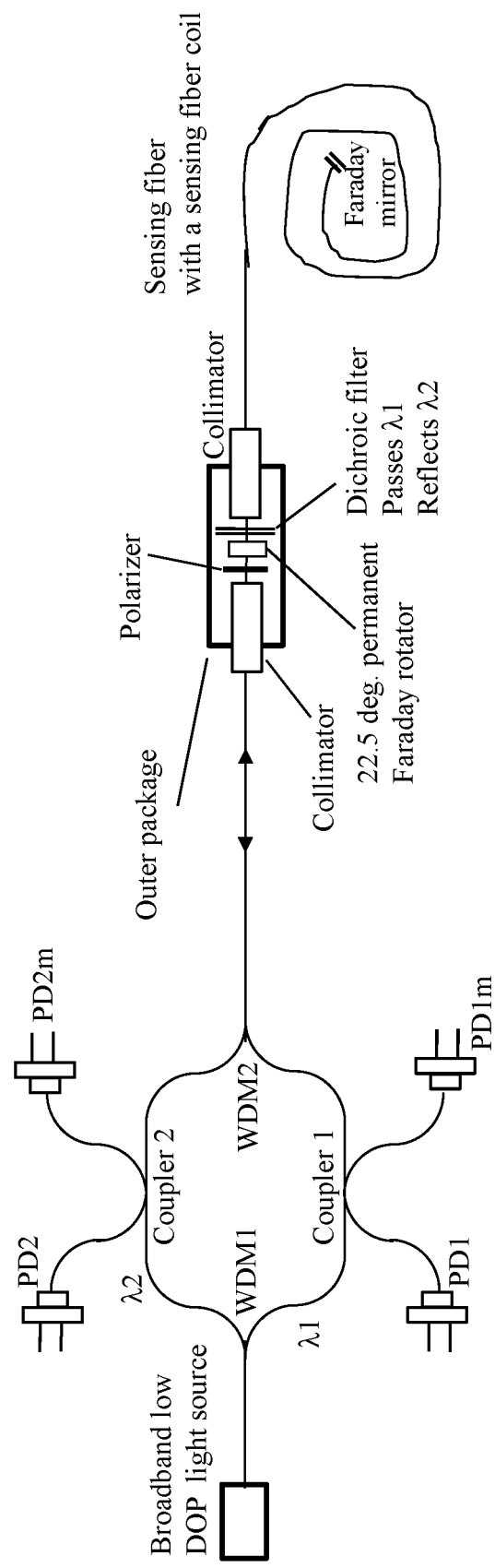
FIG. 17 illustrates an embodiment of a reflective magnetic sensor using a length of fiber to replace the Faraday sensing material in FIG. 10.
Figure 18:
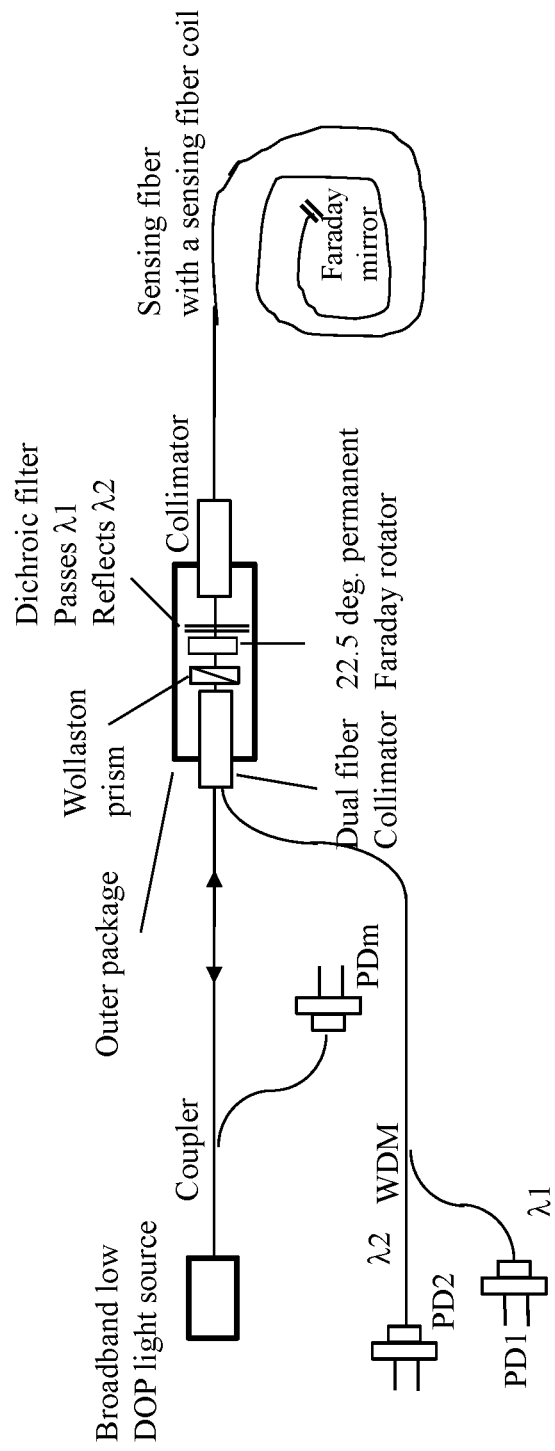
FIG. 18 illustrates an embodiment of a reflective magnetic sensor using a length of fiber to replace the Faraday sensing material in FIG. 11.
Figure 19:
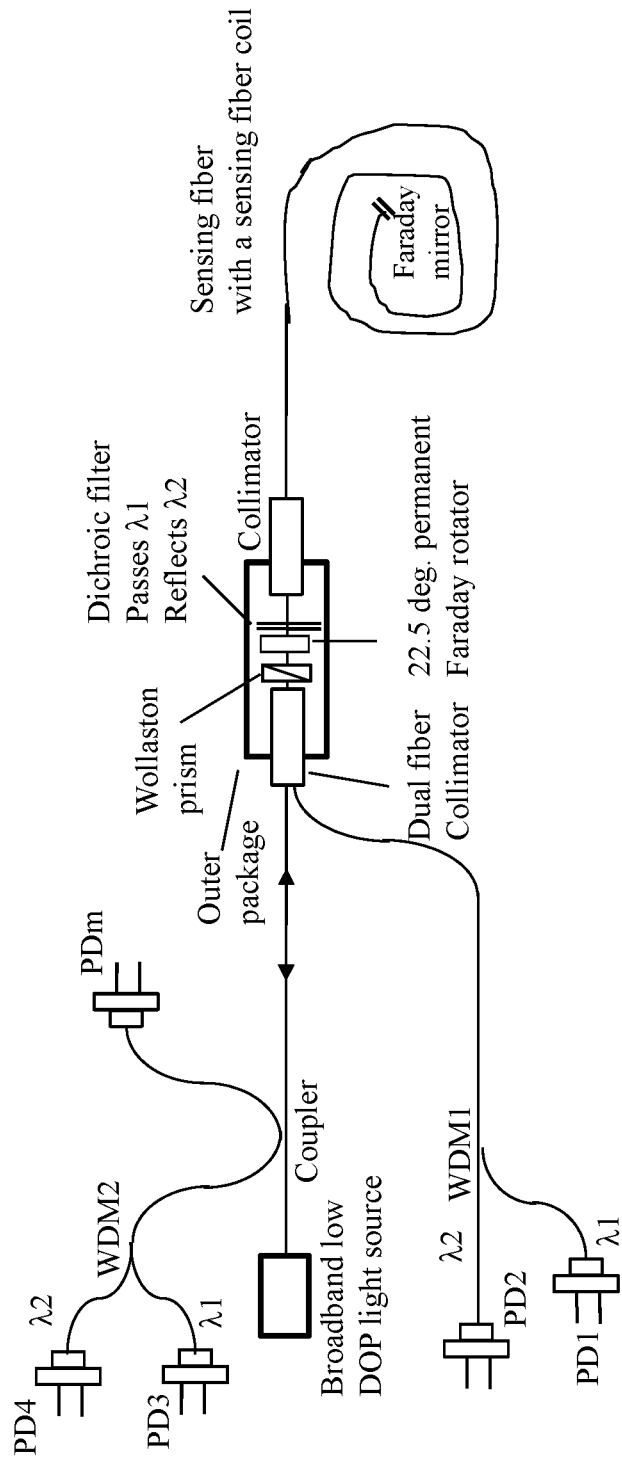
FIG. 19 illustrates an embodiment of a reflective magnetic sensor using a length of fiber to replace the Faraday sensing material in FIG. 11.

FIG. 16 illustrates an embodiment of a reflective magnetic sensor using a length of fiber to replace the Faraday sensing material in FIG. 9. FIG. 17 illustrates an embodiment of a reflective magnetic sensor using a length of fiber to replace the Faraday sensing material in FIG. 10. FIG. 18 illustrates an embodiment of a reflective magnetic sensor using a length of fiber to replace the Faraday sensing material in FIG. 11. FIG. 19 illustrates an embodiment of a reflective magnetic sensor using a length of fiber to replace the Faraday sensing material in FIG. 11, with an additional WDM (WDM2) to separate the two wavelength channels for sending to PD3 and PD4 respectively.

Figure 20:
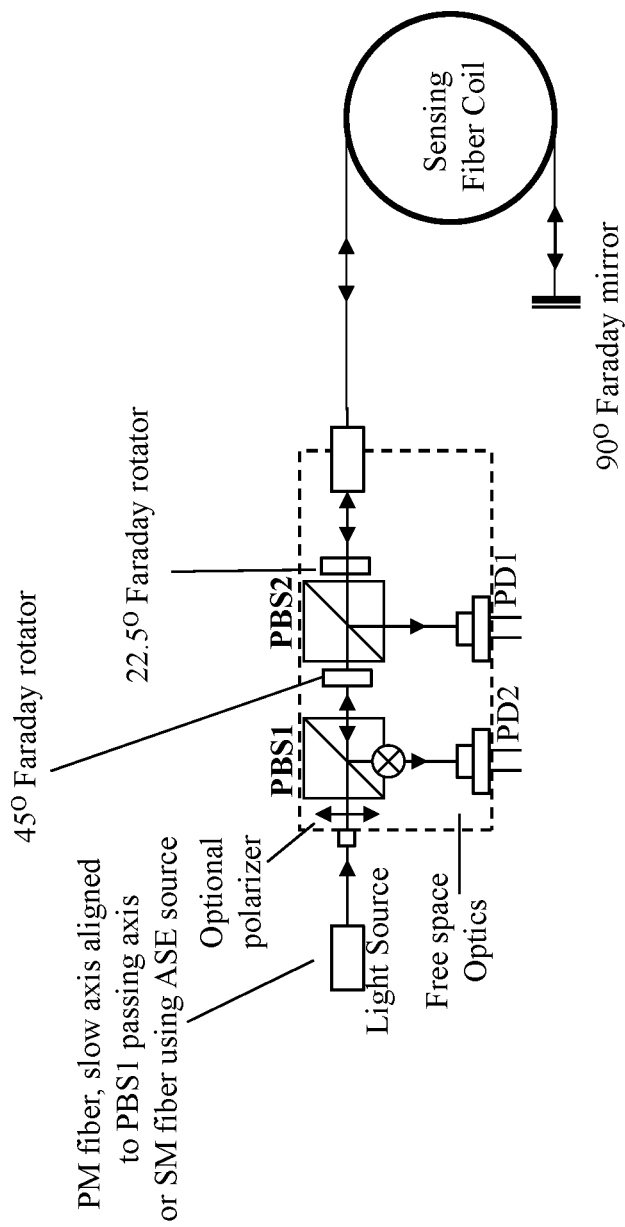
FIG. 20 illustrates another embodiment of a reflective magnetic sensor using a length of fiber as the sensing medium as an example of another sensor design.

FIG. 20 illustrates another embodiment of a reflective magnetic sensor using a length of fiber as the sensing medium as an example of another sensor design.

In this sensor design in FIG. 20, a current sensor based on optical sensing in a fiber coil includes a light source that produces probe light; a first polarization splitting device coupled to receive the probe light from the light source and produces light in a first polarization only as a first polarized light beam and light in a second, different polarization only as a second polarized light beam; a first Faraday rotator placed to receive the first polarized light beam from the first polarization splitting device to produce an output light beam with a rotated polarization; a second polarization splitting device coupled to receive the output light beam from the first Faraday rotator to produce light in a third polarization only as a third polarized light beam and light in a fourth polarization different from the third polarization as a fourth polarized light beam; a second Faraday rotator placed to receive the third polarized light beam from the second polarization splitting device to produce a second output light beam; a fiber line coupled to receive the second output beam from the Faraday rotator and configured to include a sensing fiber coil that is wrapped around a segment of a conductor carrying a current to be measured to sense a magnetic field produced by the current in the conductor; and a Faraday reflector coupled to receive light from the sensing fiber coil and to reflect the received light back into the sensing fiber coil to return to the second Faraday rotator which transmits the returned light to the second polarization splitting device which splits the returned light into light in the third polarization and light in the fourth polarization. This current sensor also includes a first optical detector coupled to receive and detect the returned light in the fourth polarization from the second polarization splitting device which directs the returned light in the third polarization to transmit through the first Faraday rotator to reach the first polarization splitting device; a second optical detector coupled to receive and detect the returned light in the second polarization from the first polarization splitting device; and a measurement module that receives an detector outputs from the first and second optical detectors to obtain information of the current.

The example in FIG. 20 is a specific implementation, where the above first polarization splitting device is represented by a PBS1, the first optical detector is represented by PD1, the second polarization splitting device is represented by a PBS2, and the second optical detector is represented by PD2. The first Faraday rotator is a 45-degree Faraday rotator and the second Faraday rotator is a 22.5-degree Faraday rotator. Light from the light source is coupled to the optical head with a PM fiber or a SM fiber, and passes through an optional polarizer to clean up the polarization to be totally linear. The SOP of the light is aligned with the passing axis of PBS1 so that the light passes the PBS1 with a minimum insertion loss. After PBS1, the SOP is rotated 45 degrees and be aligned to the passing axis of PBS2 so that the light passes PBS2 with a minimum loss. After PBS2, light passes through a 22.5 degree Faraday rotator and then is coupled into a sensing fiber with a collimator. At the other end of the fiber, the light is reflected by a Faraday mirror to pass through the 22.5 degree Faraday rotator the second time with a total 45 degrees SOP rotation when the magnetic field to be sensed is zero. The s component of the light is reflected out by PBS2 into PD1 and the p component passes through PBS2. The p component is further rotated another 45 degrees by the 45 degree Faraday rotator so that it is totally reflected by PBS1 into PD2. Again, the photovoltages from the detected photocurrents can be expressed by Eqs. (5) and (6), assuming the electrical gains are properly adjusted, and the polarization rotation angle can be obtained Eq. (7).

$$V_1 = V_0(1-\sin 2\theta) \quad (10)$$

$$V_2 = V_0(1+\cos 2\theta) \quad (11)$$

Because both sin and cos of the polarization rotation angle are present, any arbitrary large rotation angle can be obtained without ambiguity. Therefore, one may use a long sensing fiber to increase the detection sensitivity without causing detection ambiguity.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document and attached appendices.

What is claimed is:

1. A current sensor based on optical sensing, comprising:
   a light source that produces probe light of a low degree of polarization;
   a fiber line having a first fiber line terminal coupled to receive the probe light from the light source and to direct the received probe light to a second fiber line terminal of the fiber line;
   an optical current sensor head coupled to the second fiber line terminal of the fiber line to receive the probe light and configured to include an input optical polarizer to filter the probe light to produce a polarized input beam, a first Faraday material that is magnetically shielded from an influence of any external magnetic field and located along an optical path of the polarized input beam, a second Faraday material that is not magnetically shielded and placed in an optical path of the polarized input beam to sense a magnetic field produced by a direct current or an alternating current to be measured, and an optical reflector downstream from the first and second Faraday materials along an optical path of the polarized input beam to reflect the polarized input beam back to the first and second Faraday materials and the input optical polarizer to return to the fiber line;
   an optical detection unit including an optical detector coupled to the fiber line to receive at least a portion of the reflected light in the fiber line from the optical current sensor head that carries information of the current to be measured and to generate a detector output signal carrying the information of the current and a second optical detector coupled to the fiber line to receive and measure at least a portion of the probe light coming from the light source without passing through the second fiber line terminal of the fiber line to provide a second detector signal as a measurement of the probe light; and
   a measurement module that is coupled to the optical detection module, receives and processes the detector output signal from the optical detector and the second detector signal as the measurement of the probe light from the second optical detector to obtain information of the current.

2. The current sensor as in claim 1, wherein the measurement module is structured to be operable to apply the measurement of the probe light from the second optical detector to account for a power drift of the probe light of the low degree of polarization in obtaining the information of the current when the current is a direct current.

3. The current sensor as in claim 1, wherein the optical current sensor head is free of an optical polarization element along an optical path downstream from the first and second Faraday materials and upstream from the optical reflector.

4. The current sensor as in claim 1, wherein the measurement module includes an amplifier circuit to amplify the detector output from the optical detector, an analog to digital converter to convert an output of the amplifier circuit into a digital signal, and a microprocessor to process the digital signal representing information of the current.

5. A temperature sensor based on optical sensing, comprising:
   a light source that produces probe light of a low degree of polarization;
   a fiber line having a first fiber line terminal coupled to receive the probe light from the light source and to direct the received probe light to a second fiber line terminal of the fiber line;
   an optical temperature sensor head coupled to the second fiber line terminal of the fiber line to receive the probe light and configured to include an input optical polarizer to filter the probe light to produce a polarized input beam, a Faraday material that is magnetically shielded from an influence of any external magnetic field and located along an optical path of the polarized input beam and varies a Faraday rotation angle in response to a change in temperature at the Faraday material, and an optical reflector downstream from the Faraday material along an optical path of the polarized input beam to reflect the polarized input beam back to the Faraday material and the input optical polarizer to return to the fiber line;
   an optical detector coupled to the fiber line to receive at least a portion of the reflected light in the fiber line from the optical temperature sensor head that carries information of the temperature to be measured to generate a detector output signal carrying the information of the temperature;

a second optical detector coupled to the fiber line to receive and measure at least a portion of the probe light coming from the light source without passing through the second fiber line terminal of the fiber line to provide a second detector signal as a measurement of the probe light; and a measurement module coupled to receive the detector output signal from the optical detector and the second detector signal from the second optical detector and to obtain information of the temperature at the temperature sensor head based on both the detector signal and the second detector signal.

6. The temperature sensor as in claim 5, wherein the measurement module includes an amplifier circuit to amplify the detector output from the optical detector, an analog to digital converter to convert an output of the amplifier circuit into a digital signal, and a microprocessor to process the digital signal representing information of the temperature.

7. An optical sensor system for measuring temperature and an electric current based on optical sensing, comprising a base station including a light source that produces probe light of a low degree of polarization, an optical coupler that splits the probe light into a first probe beam and a second probe beam;

an optical sensor head that is separate from the base station and includes a current sensor that receives probe light from the first probe beam and a temperature sensor that receives probe light from the second probe beam;

a first fiber line coupled between the base station and the current senor in the optical sensor head to transmit the first probe beam to the current sensor; and a second fiber line coupled between the base station and the temperature sensor in the optical sensor head, wherein the current sensor is configured to include an input optical polarizer to filter the probe light to produce a polarized input beam, a first Faraday material that is magnetically shielded from an influence of any external magnetic field and located along an optical path of the polarized input beam, a second Faraday material that is not magnetically shielded and placed in an optical path of the polarized input beam to sense a magnetic field produced by a current to be measured, and an optical reflector downstream from the first and second Faraday materials along an optical path of the polarized input beam to reflect the polarized input beam back to the first and second Faraday materials and the input optical polarizer to return to the first fiber line, wherein the base station further includes a current optical detection unit including an optical detector coupled to the first fiber line to receive at least a portion of the reflected light in the first fiber line from the current sensor head that carries information of the current to be measured to generate a detector output signal carrying the information of the current and a second optical detector coupled to the first fiber line to receive and measure at least a portion of the probe light coming from the light source without passing through the first fiber line to reach the optical sensor head to provide a second detector signal as a measurement of the probe light, wherein the temperature sensor head is configured to include an input optical polarizer to filter the probe light to produce a polarized input beam, a Faraday material that is magnetically shielded from an influence of any external magnetic field and located along an optical path of the polarized input beam and varies a Faraday rotation angle in response to a change in temperature at the Faraday material, and an optical reflector downstream from Faraday material along an optical path of the polarized input beam to reflect the polarized input beam back to the Faraday material and the input optical polarizer to return to the second fiber line, and wherein the base station further includes an optical detector coupled to the second fiber line to receive at least a portion of the reflected light in the second fiber line from the temperature sensor head that carries information of the temperature to be measured, and operates to process a detector output from the optical detector coupled to the second fiber line to obtain information on the temperature to be measured, and wherein the base station further operates to process the detector output signal from the optical detector and the second detector signal as the measurement of the probe light from the second optical detector to obtain information of the current.

* * * * *